United States Patent
Goto et al.

(10) Patent No.: US 9,749,562 B2
(45) Date of Patent: Aug. 29, 2017

(54) LIQUID CRYSTAL DISPLAY AND INFRARED IMAGE SENSOR ON SILICON

(71) Applicant: OmniVision Technologies, Inc., Santa Clara, CA (US)

(72) Inventors: Takayuki Goto, Foster City, CA (US); Yin Qian, Milpitas, CA (US); Chen-wei Lu, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 3 days.

(21) Appl. No.: 14/941,254

(22) Filed: Nov. 13, 2015

(65) Prior Publication Data

US 2017/0142360 A1    May 18, 2017

(51) Int. Cl.

| | |
|---|---|
| *H04N 5/225* | (2006.01) |
| *H04N 5/369* | (2011.01) |
| *H04N 5/33* | (2006.01) |
| *G06F 3/01* | (2006.01) |
| *G02B 27/01* | (2006.01) |
| *G02B 27/00* | (2006.01) |
| *G02F 1/1337* | (2006.01) |
| *H01L 27/146* | (2006.01) |

(52) U.S. Cl.
CPC ....... *H04N 5/3696* (2013.01); *G02B 27/0093* (2013.01); *G02B 27/0172* (2013.01); *G02F 1/133723* (2013.01); *G02F 1/133784* (2013.01); *G06F 3/013* (2013.01); *H01L 27/14625* (2013.01); *H01L 27/14636* (2013.01); *H01L 27/14649* (2013.01); *H01L 27/14685* (2013.01); *H04N 5/33* (2013.01); *G02B 2027/0138* (2013.01)

(58) Field of Classification Search
CPC ............................. H04N 13/0429; H04N 13/044
See application file for complete search history.

(56) References Cited

U.S. PATENT DOCUMENTS

| | | | | |
|---|---|---|---|---|
| 2004/0263670 | A1* | 12/2004 | Yamasaki | G06F 3/0412 348/340 |
| 2006/0033114 | A1* | 2/2006 | Schranz | H01L 27/14621 257/88 |
| 2011/0141333 | A1* | 6/2011 | Naruse | H01L 27/14621 348/308 |
| 2013/0241907 | A1* | 9/2013 | Amirparviz | G02B 27/0093 345/207 |

* cited by examiner

Primary Examiner — Twyler Haskins
Assistant Examiner — Dwight C Tejano
(74) Attorney, Agent, or Firm — Larry E. Henneman, Jr.; Gregory P. Gibson; Henneman & Associates, PLC

(57) ABSTRACT

A novel head mounted display includes a display/image sensor. In a particular embodiment the display/image sensor is formed on a single silicon die, which includes display pixels and light sensor pixels. The display pixels and light sensor pixels are each arranged in rows and columns, and the arrays of light sensor pixels and display pixels are interlaced. The center of each light sensor pixel is located between adjacent rows and adjacent columns of display pixels.

24 Claims, 13 Drawing Sheets

LIQUID CRYSTAL DISPLAY AND INFRARED IMAGE SENSOR ON SILICON

BACKGROUND OF THE INVENTION

Field of the Invention

This invention relates generally to image sensors and displays. In addition, this invention relates to wearable technology including image sensors and displays, and more particularly to head mounted displays (HMDs) including image sensors and displays.

Description of the Background Art

As wearable technology becomes more popular, it is increasingly important for manufacturers to design gadgets that are as comfortable and functional as possible. Head mounted displays (HMDs) are a form of wearable technology that is worn on the head, often mounted to a user's glasses or other type of headwear. Users typically interact with HMDs using voice commands or via buttons/touchpads on the device. It is desirable for users to interact with HMDs in other ways, such as by gesturing with hands or eyes.

Currently, HMDs are capable of tracking users' eye movements and associating those movements with specific actions, such as taking a picture or opening a notification. Known HMDs utilize an infrared (IR) light source, positioned to direct IR light onto the eye of the wearer. This light reflects off the eye and onto an IR sensor, which detects, in real time, whether the eye is open or closed, and, if open, in which direction the pupil is pointing. This allows the user to interact with the device simply by looking at objects, blinking, etc.

Another important capability of HMDs is the ability to display visible information to the user. This information is projected directly into the user's eye, such that visual information projected by the device will appear seamlessly in the user's surroundings. Current HMD's utilize a liquid crystal on silicon (LCOS) display, a light source, and optics to display images.

Significant drawbacks of current HMDs include size and cost of manufacture. One proposed solution for minimizing the size and cost of an HMD is to place both the LCOS pixels and the IR sensor pixels on a single silicon die (a combination device) and using a common optical path to project images and detect IR light.

In known combination devices, groups of LCOS pixels and IR sensor pixels are arranged in alternating columns or in a checkerboard configuration. These configurations are problematic, because the IR sensor pixels create lines, dots, gaps, or other visible defects in the image generated by the LCOS display. Similarly, the LCOS pixels create lines, dots, gaps, or other visible defects in the image captured by the IR sensor pixels, thereby limiting the resolution and uniformity of the image captured by IR sensor and/or creating problems in eye detection. What is needed, therefore, is a combined LCOS display and IR sensor that reduces visible defects in a projected image. What is also needed is a combined LCOS display and IR sensor with improved IR sensor resolution and/or uniformity.

SUMMARY

The present invention overcomes the problems associated with the prior art by providing an integrated image sensor and display device that captures and displays more uniform images. The invention facilitates the display of high quality images and the accurate detection of eye or body gestures, while reducing defects in the displayed and/or captured images.

An example integrated image sensor and display device, includes a substrate, display pixels formed on the substrate, and image sensor pixels formed on the same substrate. The display pixels are arranged in rows and columns, and the image sensor pixels are also arranged in rows and columns. Each of the image sensor pixels has a center disposed between adjacent rows of the display pixels and between adjacent columns of the display pixels.

In an example embodiment, each of the display pixels has an area at least 24 times larger than the area of each of the image sensor pixels. In a particular example embodiment, only one of the image sensor pixels is disposed between each group of four adjacent display pixels. Even more particularly, each of the image sensor pixels is disposed between truncated corners of four adjacent display pixels. Optionally, the image sensor pixels include one fewer rows and one fewer columns than the display pixels. Each of the image sensor pixels is spaced apart from every other one of the image sensor pixels by a distance greater than the width of one of the image sensor pixels.

An example embodiment includes pixel electrodes, each associated with one of the display pixels, and at least one metal interconnect layer disposed above the image sensor pixels and below the pixel electrodes of the display pixels. The metal interconnect layer(s) electronically couple the pixel electrodes with electronic devices formed in the substrate. The metal interconnect layer(s) also define openings above the image sensor pixels. Optionally, the example embodiment includes light guides formed in the openings and operative to direct incident light to the image sensor pixels.

In an example embodiment, the pitch between adjacent columns of display pixels is the same as the pitch between adjacent columns of image sensor pixels. In addition, the pitch between adjacent rows of display pixels is the same as the pitch between adjacent rows of image sensor pixels.

In a particular disclosed embodiment, the display pixels are liquid crystal on silicon (LCOS) pixels, and the image sensor pixels are infrared (IR) light sensor pixels.

A method of manufacturing an integrated image sensor and display device is also described. The method includes providing a substrate, forming display pixels on the substrate, and forming image sensor pixels on the substrate. The display pixels and image sensor pixels are arranged in rows and columns. Each of the image sensor pixels has a center disposed between adjacent rows and adjacent columns of the display pixels.

In an example method, the step of forming the plurality of display pixels includes forming each of the display pixels to have an area at least 24 times larger than the area of each of the image sensor pixels. In a particular example method, the step of forming the plurality of image sensor pixels includes arranging only one of the image sensor pixels between each group of four adjacent display pixels. In an even more particular method the step of forming the plurality of image sensor pixels includes arranging each of the image sensor pixels between truncated corners of four adjacent display pixels.

In the example method, the step of forming the plurality of image sensor pixels includes spacing each of the image sensor pixels apart from every other one of the image sensor pixels by a distance greater than a width of one of the image sensor pixels. Optionally, the step of forming the plurality of image sensor pixels includes forming one fewer rows of the image sensor pixels than of the display pixels and forming one fewer columns of the image sensor pixels than of the display pixels.

The example method further includes forming pixel electrodes, and forming at least one metal interconnect layer above the image sensor pixels and below the pixel electrodes. Each of the pixel electrodes is associated with one of the display pixels, and the metal interconnect layer(s) electronically couple(s) the pixel electrodes to electronic devices formed in the substrate. The metal interconnect layer(s) define(s) openings over the image sensor pixels and, optionally, the example method includes forming light guides in the openings. The pitch between adjacent columns of the display pixels is the same as the pitch between adjacent columns of the image sensor pixels and, consequently, the pitch between adjacent columns of openings. Similarly, the pitch between adjacent rows of the display pixels is the same as the pitch between adjacent rows of the image sensor pixels and, consequently, the pitch between adjacent rows of openings.

In the example method the display pixels are liquid crystal on silicon (LCOS) display pixels, and the image sensor pixels are infrared (IR) light sensor pixels.

A sensor enabled display is also described. The sensor enabled display includes a first light source, a second light source, a display panel including a substrate, and optics. The first light source is configured to emit light within a first range of wavelengths and the second light source is configured to emit light within a second range of wavelengths to illuminate an object. Display pixels and image sensor pixels are arranged on the substrate in rows and columns. The optics are configured to direct light from the first light source to the display pixels of the panel to display an image. The optics also direct light from the second light source reflected from the object to the image sensor pixels. In the example embodiment, each of the image sensor pixels has a center disposed between adjacent rows of the display pixels and between adjacent columns of the display pixels.

BRIEF DESCRIPTION OF THE DRAWINGS

The present invention is described with reference to the following drawings, wherein like reference numbers denote substantially similar elements.

DETAILED DESCRIPTION

The present invention overcomes the problems associated with the prior art, by providing an integrated display/image sensor disposed on a single silicon die, with display pixels and image sensor pixels arranged advantageously to avoid the problems of the prior art. In the following description, numerous specific details are set forth (e.g., specific materials, polarization orientation of light beams, pixel geometries, etc.) in order to provide a thorough understanding of the invention. Those skilled in the art will recognize, however, that the invention may be practiced apart from these specific details. In other instances, details of well-known microchip fabrication practices and components have been omitted, so as not to unnecessarily obscure the present invention.

Figure 1:
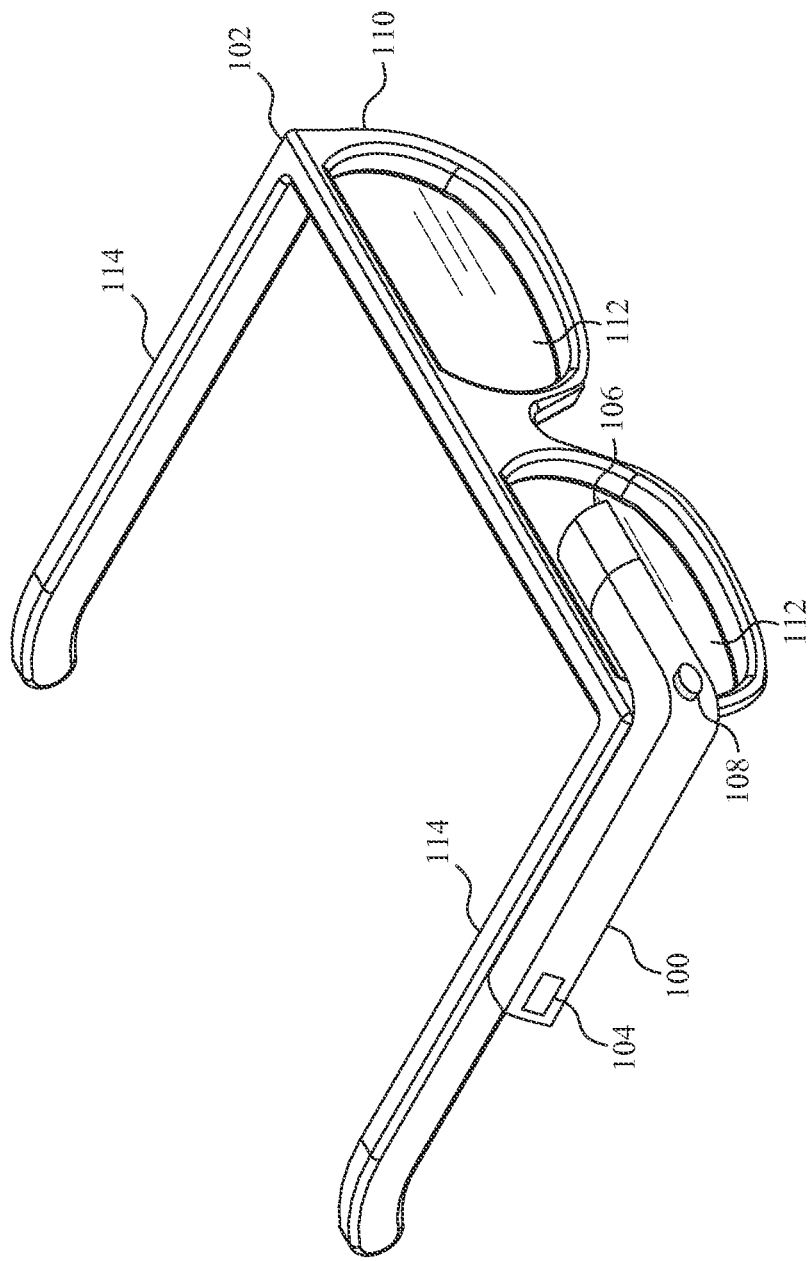
FIG. 1 is a perspective view of an example head-mounted-display (HMD) mounted to a pair of glasses.

FIG. 1 shows an example head-mounted-display (HMD) 100 mounted to a pair of glasses 102. HMD 100 includes a light source 104, optics 106 (mostly concealed in the view of FIG. 1), a projection lens module 108, and a display/image sensor (not visible in FIG. 1). Light source 104 emits visible light into HMD 100. Optics 106 direct the visible light from light source 104 to the display/imager, which modulates the visible light, and from the display/imager to the eye of a user. Projection lens module 108 projects modulated light from the display/image sensor onto a surface oriented in front of the user.

Glasses 102 include a frame 110, lenses 112, and arms 114. Frame 110 accepts lenses 112 and is coupled to arms 114. Arms 114 hold glasses 102 securely on the face of a user. In alternate embodiments, HMD 100 can be mounted to any type of headwear, including, but not limited to, hats and headbands.

Figure 2A:
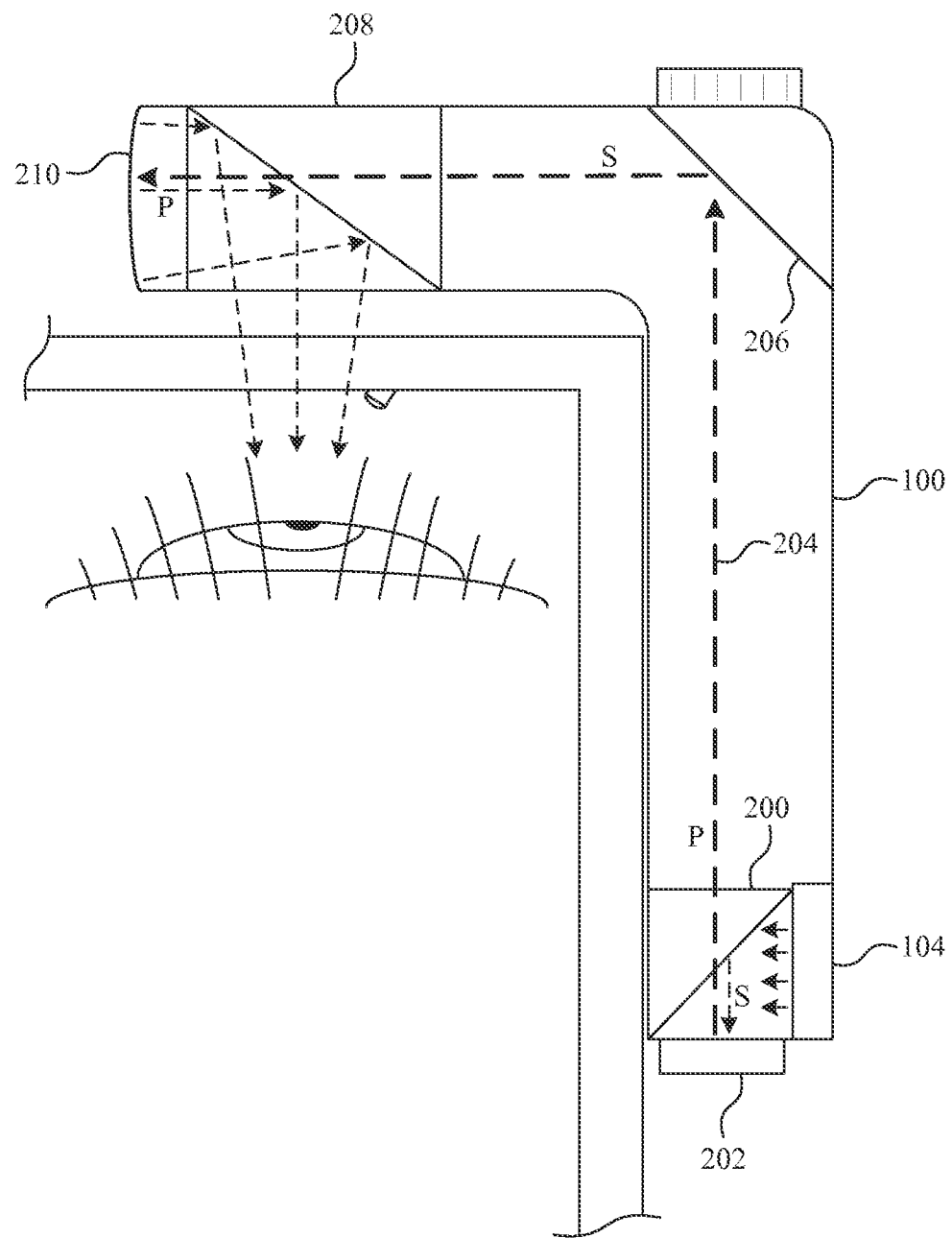
FIG. 2A is a top view (with housing removed) of the HMD of FIG. 1, showing the operation of the display.
Figure 2B:
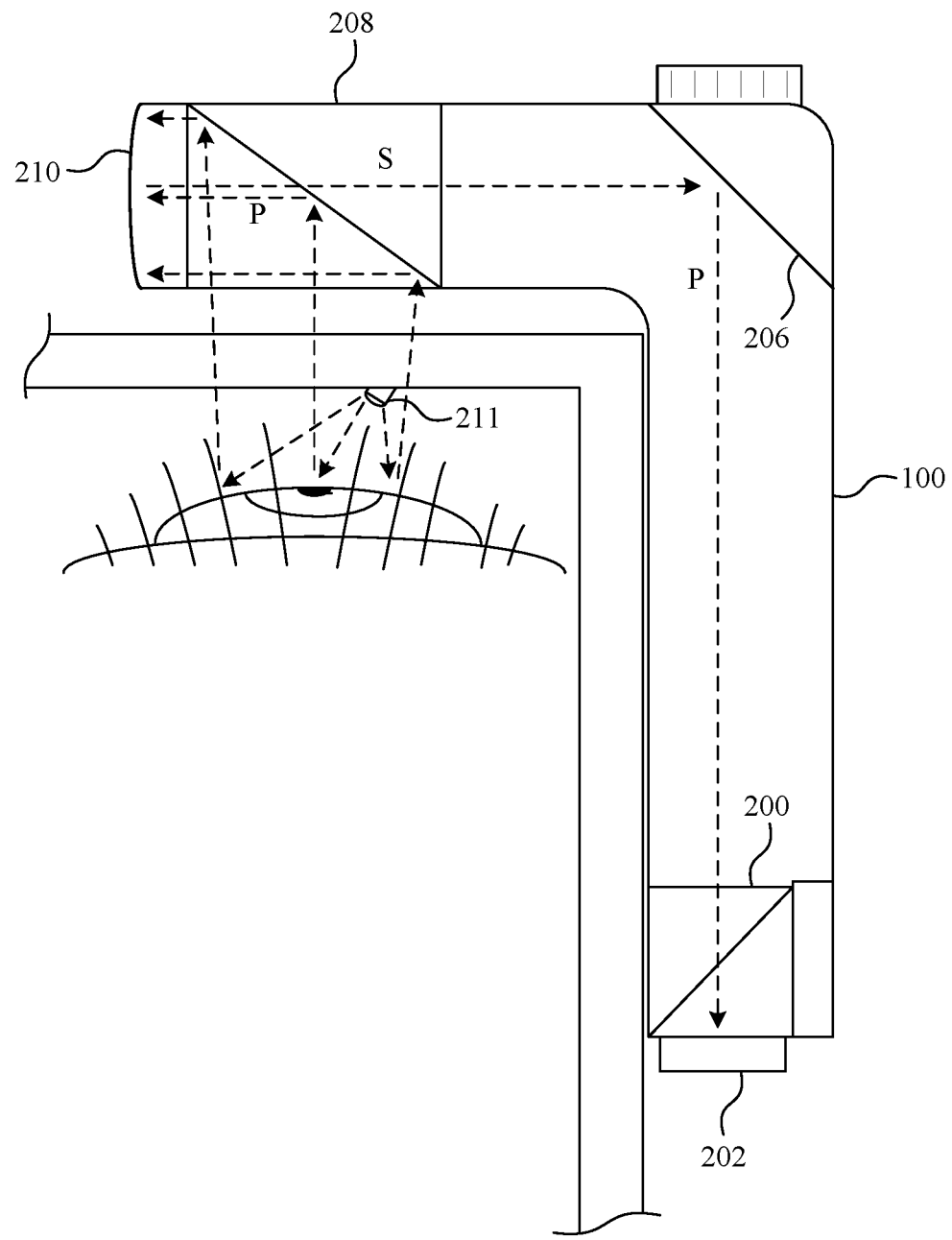
FIG. 2B is a top view (with housing removed) of the HMD of FIG. 1, showing the operation of the image sensor.
Figure 2C:
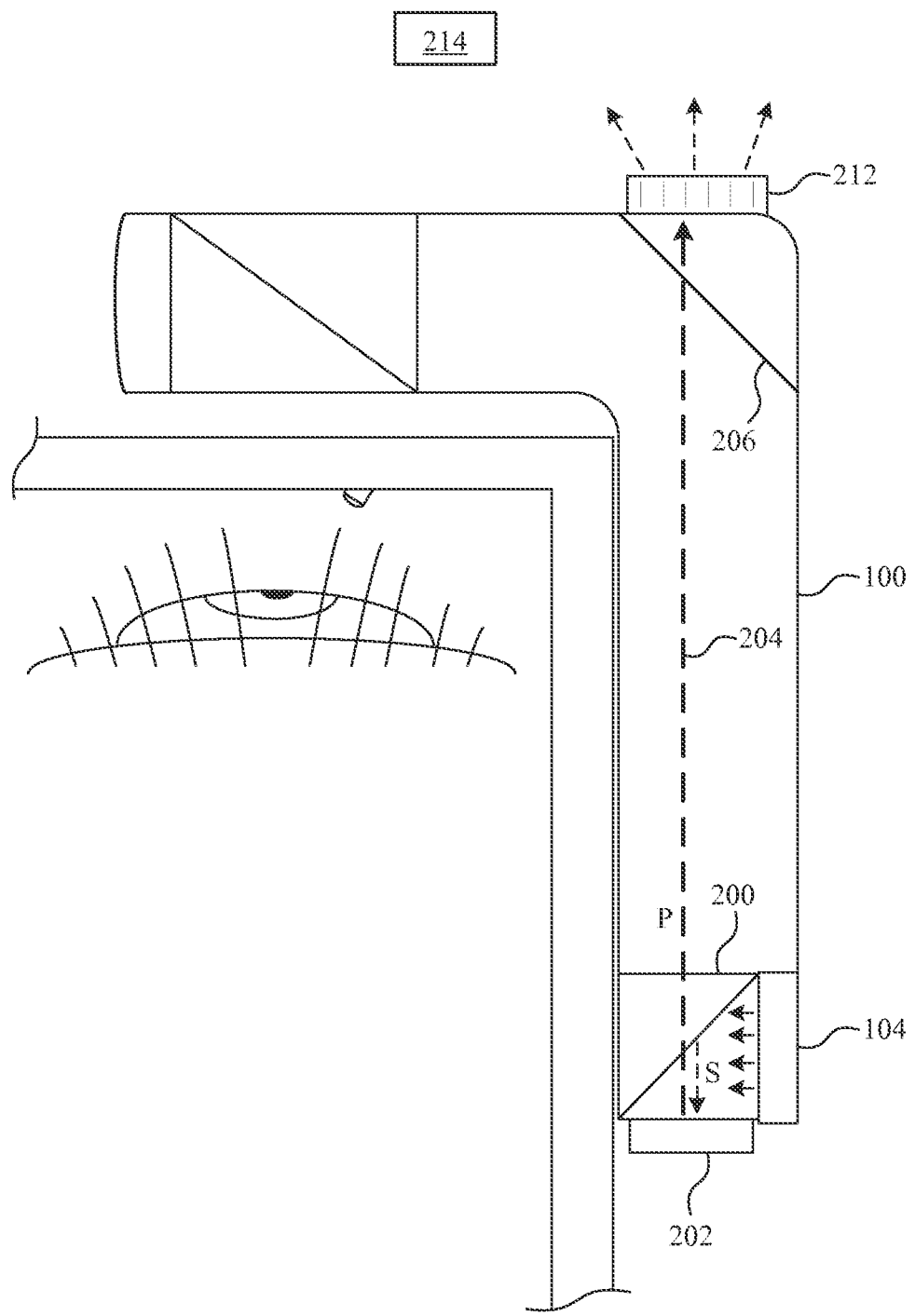
FIG. 2C is a top view of the HMD of FIG. 1, showing the operation of the projection lens module.

FIGS. 2A-2C show the internal components of HMD 100 performing the various functions of HMD 100. HMD 100 can, and generally does, perform one or more of these functions simultaneously. However, each function is depicted separately for clarity.

FIG. 2A shows HMD 100 performing a display function. Light source 104 directs visible light into a polarizing beam splitter 200, which transmits light of a first polarization orientation (P-state in the example) and reflects light of a second polarization orientation (S-oriented in the example) toward a display/image sensor 202. Display/image sensor 202 modulates light from light source 104 to form a modulated beam, which is reflected back toward beam splitter 200. Beam splitter 200 transmits the P-state portion of the modulated light to form an imaging beam 204 and directs imaging beam 204 toward a beam splitting mirror 206. Beam splitting mirror 206 reflects a portion of imaging beam 204 toward a second polarizing beam splitter 208. The reflection of imaging beam 206 by beam splitting mirror changes the polarization of the reflected portion of imaging beam 204 to the S-state. Beam splitter 208 transmits imaging beam 204 toward a concave reflective surface 210, which focuses and reflects imaging beam 204 back toward beam splitter 208. The reflection of imaging beam by concave reflective surface 210 changes the state of polarization back to the P-state, so imaging beam 204 then reflects off of beam splitter 208 and towards the eye of a user. In this manner, HMD 100 projects images into the eye of the user.

FIG. 2B shows HMD 100 performing an image sensing function. An IR light source 211 shines IR light onto the eye of a user. IR light reflects off the eye and toward beam splitter 208. Beam splitter 208 reflects a portion (P-state) of the IR light toward reflective surface 210, which reverses the polarization orientation and reflects the S-state IR light back through beam splitter 208. With the polarization orientation reversed, beam splitter 208 transmits the IR light and directs it toward mirror 206. Mirror 206 reflects the IR light, again changing the polarization state to P-state, and directs it toward beam splitter 200, which transmits it to display/image sensor 202. Display/image sensor 202 captures an image of the user's eye, which is then analyzed to determine the state/position of the user's eye. Image analysis, display data processing, system control functions, and other functions of HMD 100 are performed by a controller that is optionally formed integrally with display/image sensor 202.

FIG. 2C shows HMD 100 performing a projection function. Light source 104 emits visible light into beam splitter 200, which transmits light of a first polarization orientation and reflects light of a second polarization orientation (S-state) toward a display/image sensor 202. Display/image sensor 202 modulates light from light source 104 and reflects it back toward beam splitter 200, which passes the P-state component of the modulated light to form an imaging beam 204. A portion of imaging beam 204 passes through mirror 206 and a projection lens module 212. Projection lens module 212 focuses imaging beam 204 onto a surface 214 to form a visible image. Projection lens module 212 can be manually adjusted by the user to focus the projected image on surface 214.

In alternate embodiments, beam splitters 200 and 208 can be adapted to transmit or reflect light of opposite polarization orientations. In the current example, light source 104 is a white light emitting diode (LED). In alternate embodiments, light source 104 can be a plurality of colored LEDs, colored laser diodes, or a monochrome laser diode. Light source 104 can also include colored light filters to facilitate the creation of colored images.

In the above example, display/image sensor 202 is described within the context of HMD 100. It should be understood, however, that display/image sensor 202 can be utilized in any device that requires the display and capture of images. For example, a touchscreen kiosk can utilize display/image sensor 202 to modify displayed images in response to a user walking in front of it. Another example is a smartphone or laptop that is operated by gestures. The following description of display/image sensor 202 is consistent with the use of display/image sensor 202 in any applicable technology, and the foregoing examples are not intended to be limiting in any way.

Figure 3:
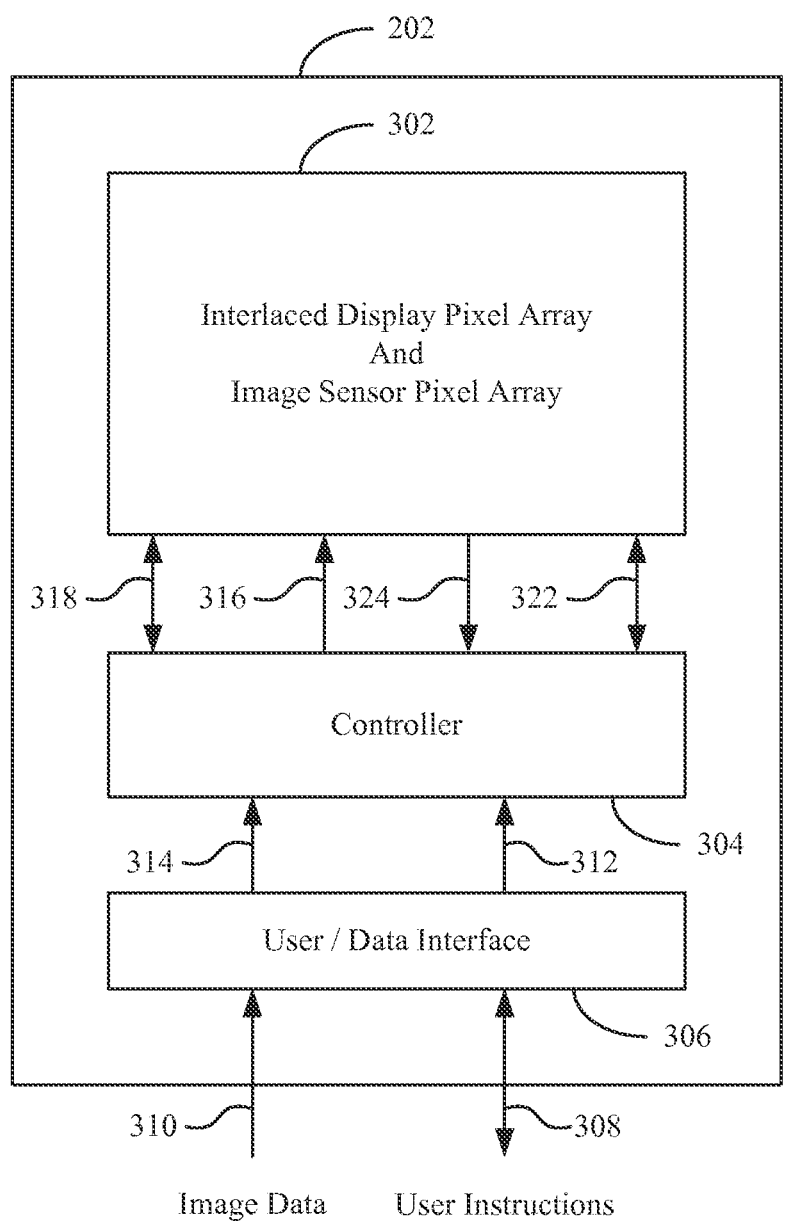
FIG. 3 is a block diagram showing a display/image sensor of FIGS. 2A-2C in greater detail.

FIG. 3 is a block diagram showing display/image sensor 202 in greater detail to include an interlaced array 302 of display pixels and image sensor pixels, a controller 304, and a user/data interface 306. User/data interface 306 receives user instructions (e.g., commands, selections, and so on), from a set of user input devices (not shown) via a user input/output 308. User/data interface 306 also receives image data (e.g., video, pictures, and so on) from one or more data sources (not shown) via a data input 310. Both user input 308 and data input 310 can be wired or wireless. User/data interface 306 provides the received user instructions and image data to controller 304 via a set of control lines 312 and a set of data lines 314, respectively. Controller 304 and/or user/data interface 306 can be formed on the same silicon chip as interlaced array 302, or on a separate device.

Controller 304 provides overall coordination control of the functionality of HMD 100. For example, controller 304 provides display data (via display data lines 316) and communicates control signals (via display control line(s) 318) to the display pixels of interlaced array 302 in order to assert the display data on the display pixels of interlaced array 302. Similarly, controller 304 communicates control signals (via sensor control lines 322) to, and receives sensor data (via sensor data lines 324) from, interlaced array 302.

Controller 304 processes images captured by interlaced array 302, analyzes the images, and responds according to the content of the analyzed images. For example, controller 304 can analyze the captured images to ascertain the state of the user's eye (e.g., position, direction, movement, blinking, etc.) and generate control signals based on the state of the user's eye. Controller 304 can then use the generated control signals to direct the internal operation of HMD or provide the control signals to an external device via user input/output 308.

Figure 4:
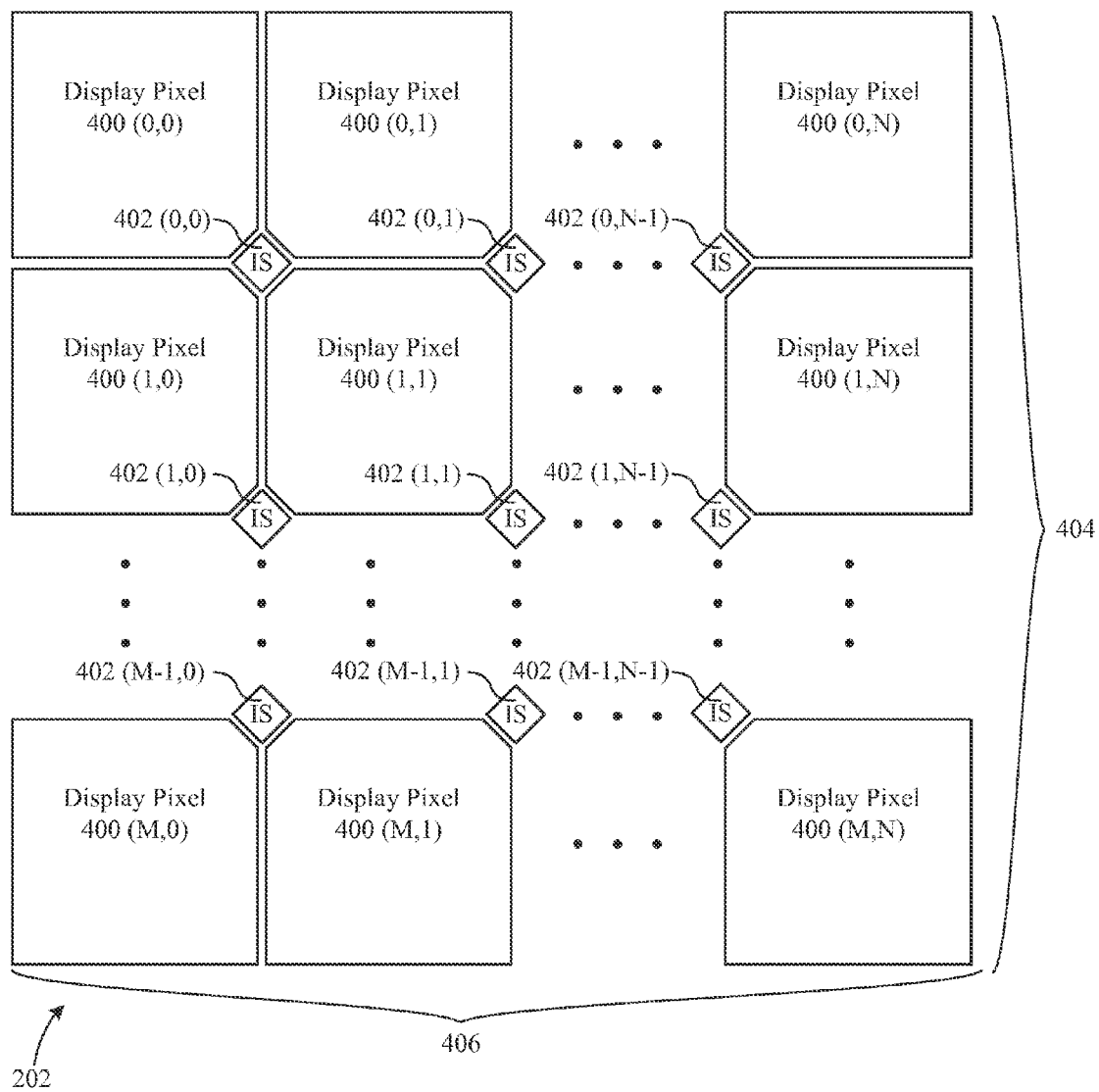
FIG. 4 is a block diagram showing the layout of pixels on the display/image sensor of FIGS. 2A-2C.

FIG. 4 is a block diagram showing the layout of display pixels and image sensor pixels on display/image sensor 202, including a plurality of display pixels 400 (m,n) and a plurality of image sensor pixels 402 (m,n) (labeled "IS"). Display pixels 400 and image sensor pixels 402 are aligned in rows 404 and columns 406, denoted by an expression (m,n) following the index of each pixel, where "m" refers to the specific row and "n" refers to the specific column.

Because every pixel along the edge of display/image sensor 202 is a display pixel 400, there are one fewer rows and one fewer columns of image sensor pixels 402 than display pixels 400 in the example embodiment. However, it is possible for either type of pixel to occupy any edge of display/image sensor 202. For example, the initial and/or final column can be an image sensor column, or the initial and/or final row can be an image sensor row. In the example embodiment, the display portion of display/image sensor 202 has a resolution of 1280×720, and the image sensor portion has a resolution of 1279×719. However, display/image sensor 202 can have any resolution within the capabilities of microchip fabrication technology, as now existing or as improved in the future.

Problems associated with the prior art are overcome by the layout of image sensor pixels 402 with respect to display pixels 400. Display pixels 400 are aligned in a uniform grid. Each of image sensor pixels 402 is disposed between the truncated corners of four adjacent display pixels 400. As a result, image sensor pixels 402 are also arranged in a uniform grid. In the example embodiment, the uniform grids of display pixels 400 and image sensor pixels 402 have the same pitch in both the column direction and row direction, and are interlaced. This advantageous layout facilitates uniform image capture and reduces blank portions in images displayed by display/image sensor 202. Thus, display/image sensor 202 facilitates the display of high quality images and allows users to effectively interact with the HMD through eye gestures.

Another aspect of the present invention is the relative sizes of the display pixels 400 and image sensor pixels 402. In the example embodiment, display pixels 400 are each approximately 5 μm wide (between parallel sides) and image sensor pixels 400 are approximately 1 μm wide (between parallel sides). The corners of each of display pixels 400 are truncated to provide space for image sensor pixels 402, while minimizing the space between adjacent display pixels 400. As a result, the area of each display pixel is 25 $\mu m^2$–1 $\mu m^2$=24 $\mu m^2$, where the 1 $\mu m^2$ is subtracted to account for the four truncated corners of each of display pixels 400. Each of the four truncated corners has an area that is approximately equal to a quarter (0.25 μm²) of the area of one of image sensor pixels 402 (1.0 μm²).

The fact that each of display pixels 400 has an area 24 times larger than the area of each of image sensor pixels 402 is advantageous, because display pixels 400 make up 96% of the total functional area of display/image sensor 202 when the display pixels 400 and image sensor pixels 402 are utilized in equal proportion. Indeed, in the example embodiment, there are more display pixels 400 than image sensor pixels 402, so less than 4% of the image displayed by display/image sensor 202 will be dark due to the absorption of light by image sensor pixels 402.

Figure 5:
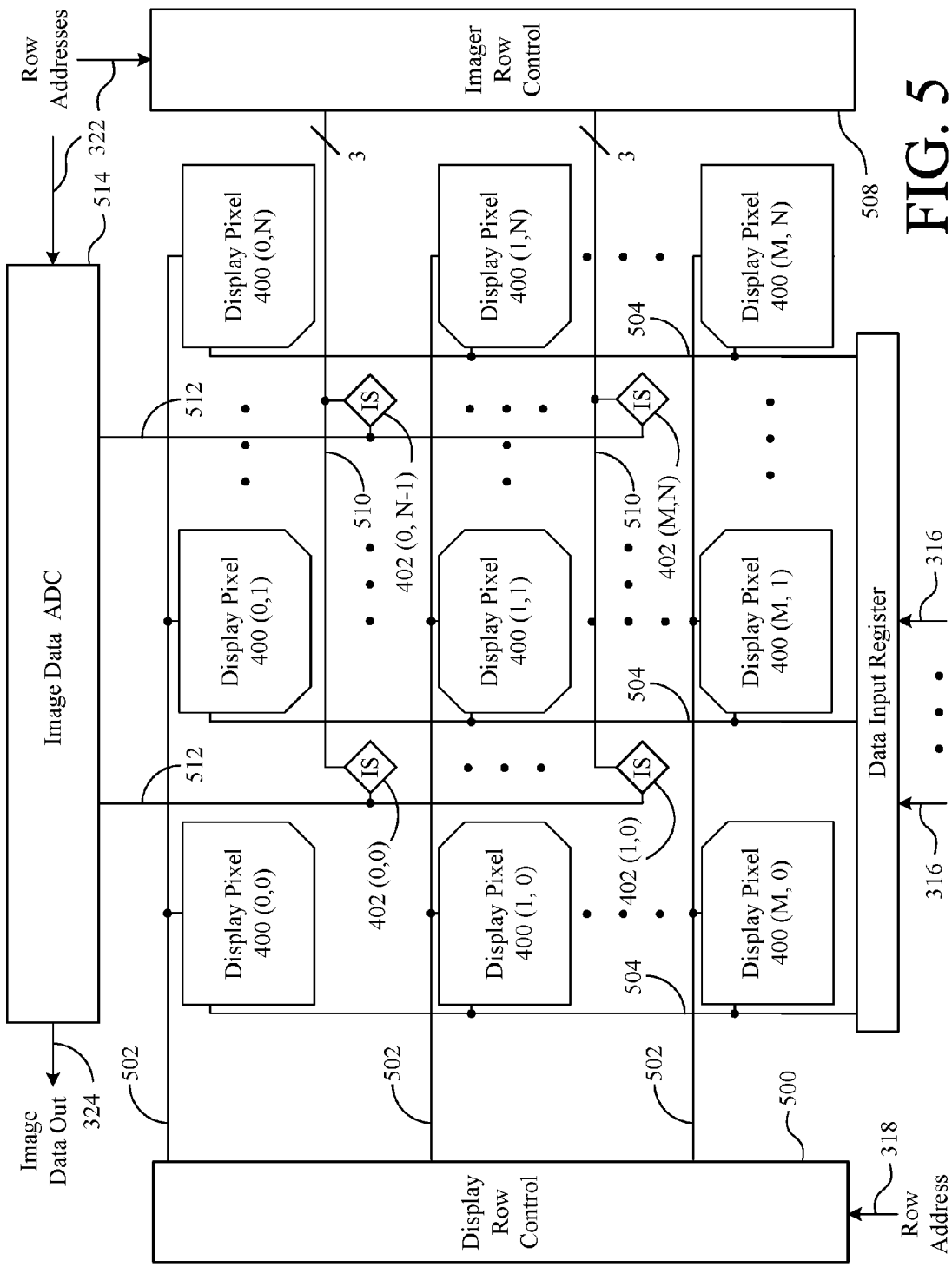
FIG. 5 is a schematic diagram showing a functional layout of pixels on the display/image sensor.

FIG. 5 is a schematic diagram showing interconnections between components of display/image sensor 202. Display pixels 400 and image sensor pixels 402 are arranged as shown in FIG. 4, except they are spaced apart to make the interconnections easier to see. The exaggerated spacing is for illustrative purposes only. In practice the space between display pixels 400 and image sensor pixels 402 is minimized to only a small fraction of their widths.

Each row of display pixels 400 is electrically coupled to a display row controller 500 via an associated one of display row lines 502. Responsive to a row address, row controller 500 asserts an enable signal on one of display row lines 502 associated with the row address. When a row of display pixels 400 is enabled, display pixels 400 of the enabled row latch image data being asserted on display column lines 504. The latched data is then asserted by the associated display pixel 400 and determines the brightness of the pixel when the display is illuminated.

Each row of image sensor pixels 402 is electrically coupled to an imager row controller 508 via three image sensor row lines 510. Image sensor row lines 510 communicate control signals to image sensor pixels 402 to coordinate three functions: resetting each image sensor pixel to a base charge, transferring accumulated charge to an isolated section of the image sensor pixel's internal circuit, and electrically coupling the isolated section of the image sensor pixel's internal circuit to one of image sensor column lines 512. The captured image data is read from each pixel into an image data analog-to-digital-converter (ADC) 514, via electrically coupled image sensor column lines 512. Responsive to control signals (e.g., row addresses, enable signals, etc.) received from controller 304 (FIG. 3) via sensor control lines 322, imager row controller 508 and image data ADC 514 operate cooperatively to read captured image data from image sensor pixels 402 one row at a time. The captured image data is then provided to controller 304 via sensor data lines 324.

Figure 6A:
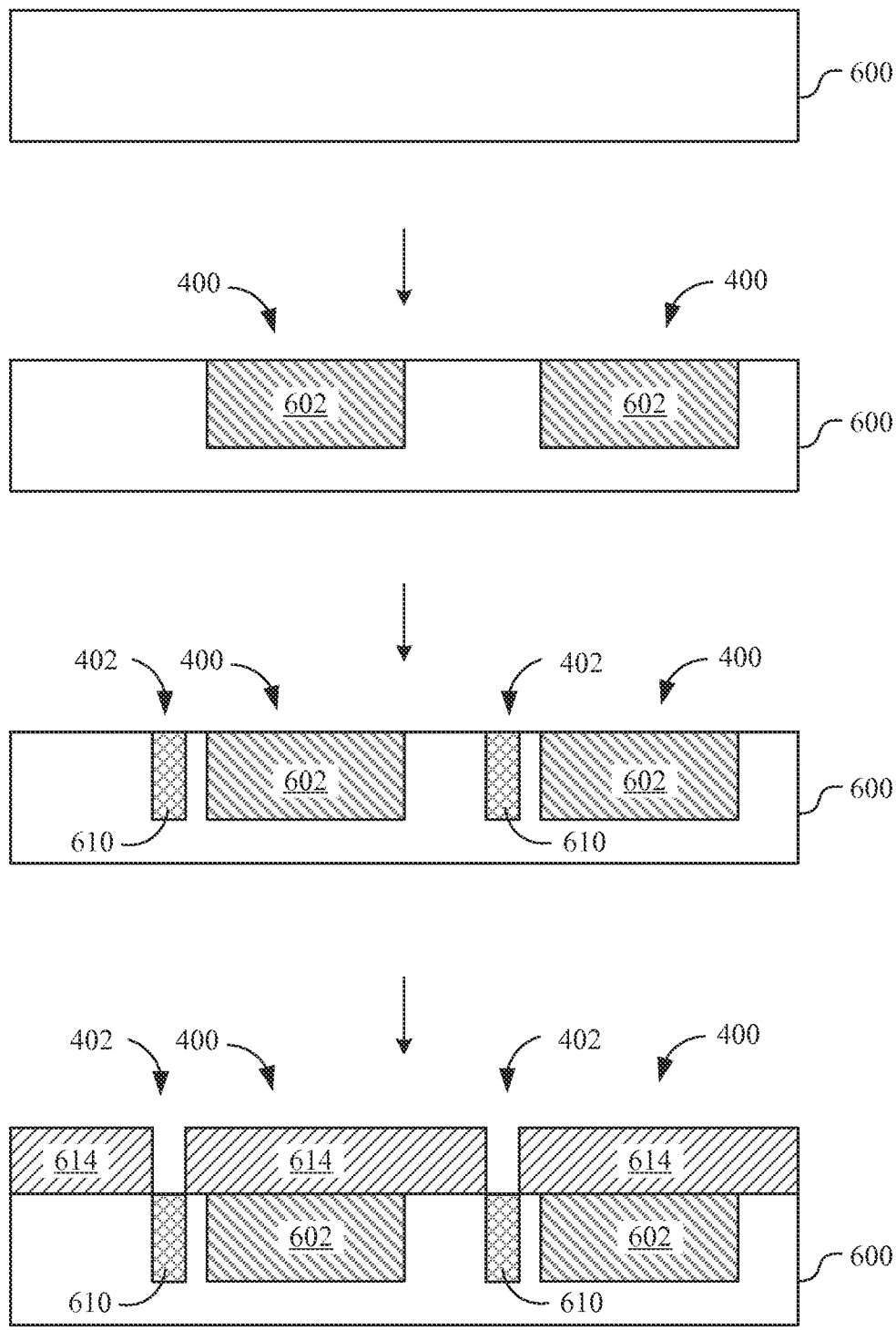
FIGS. 6A-6C are cross-sectional views illustrating the processing of a silicon wafer to form a display/image sensor.
Figure 6B:
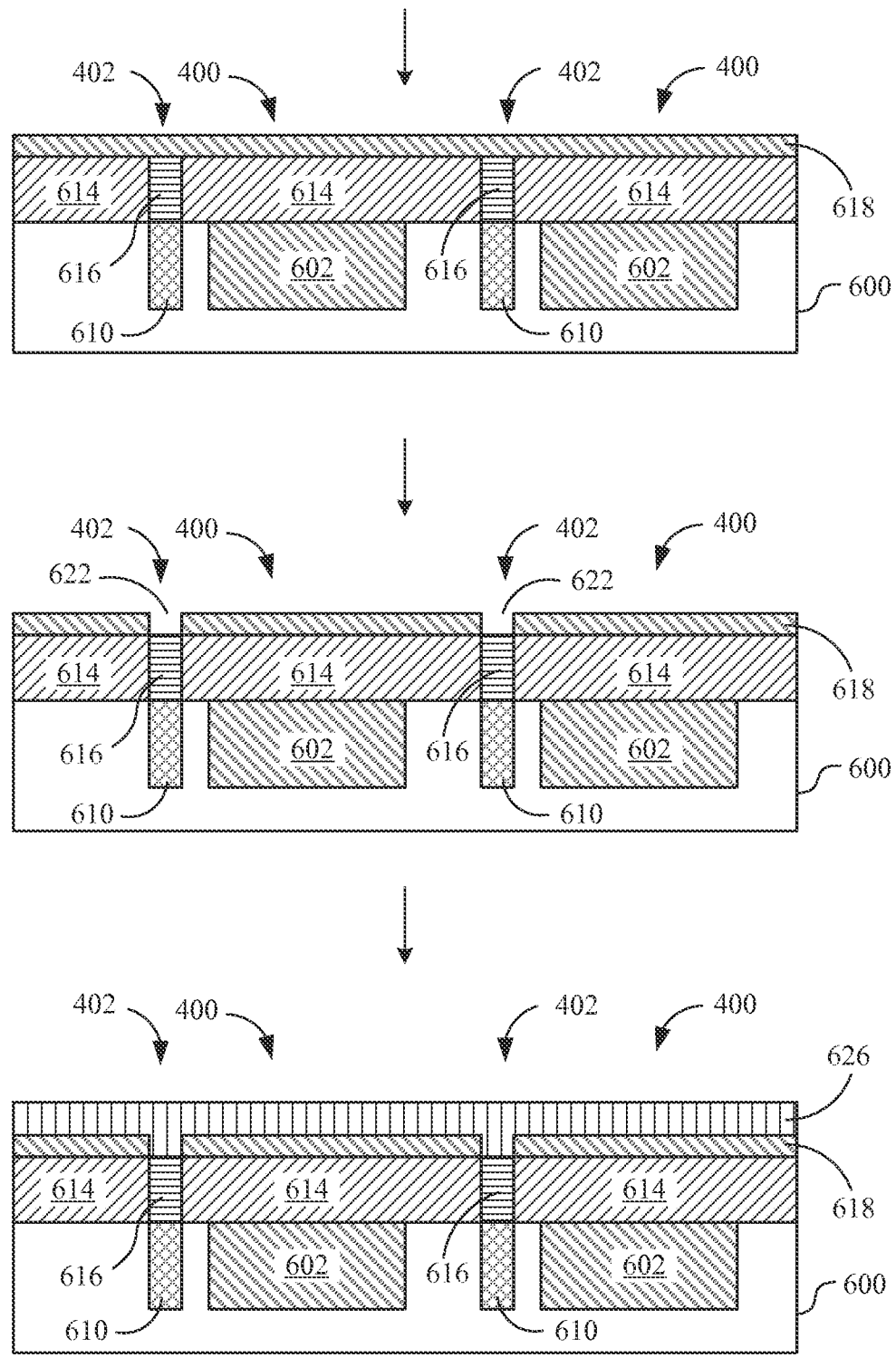
Figure 6C:
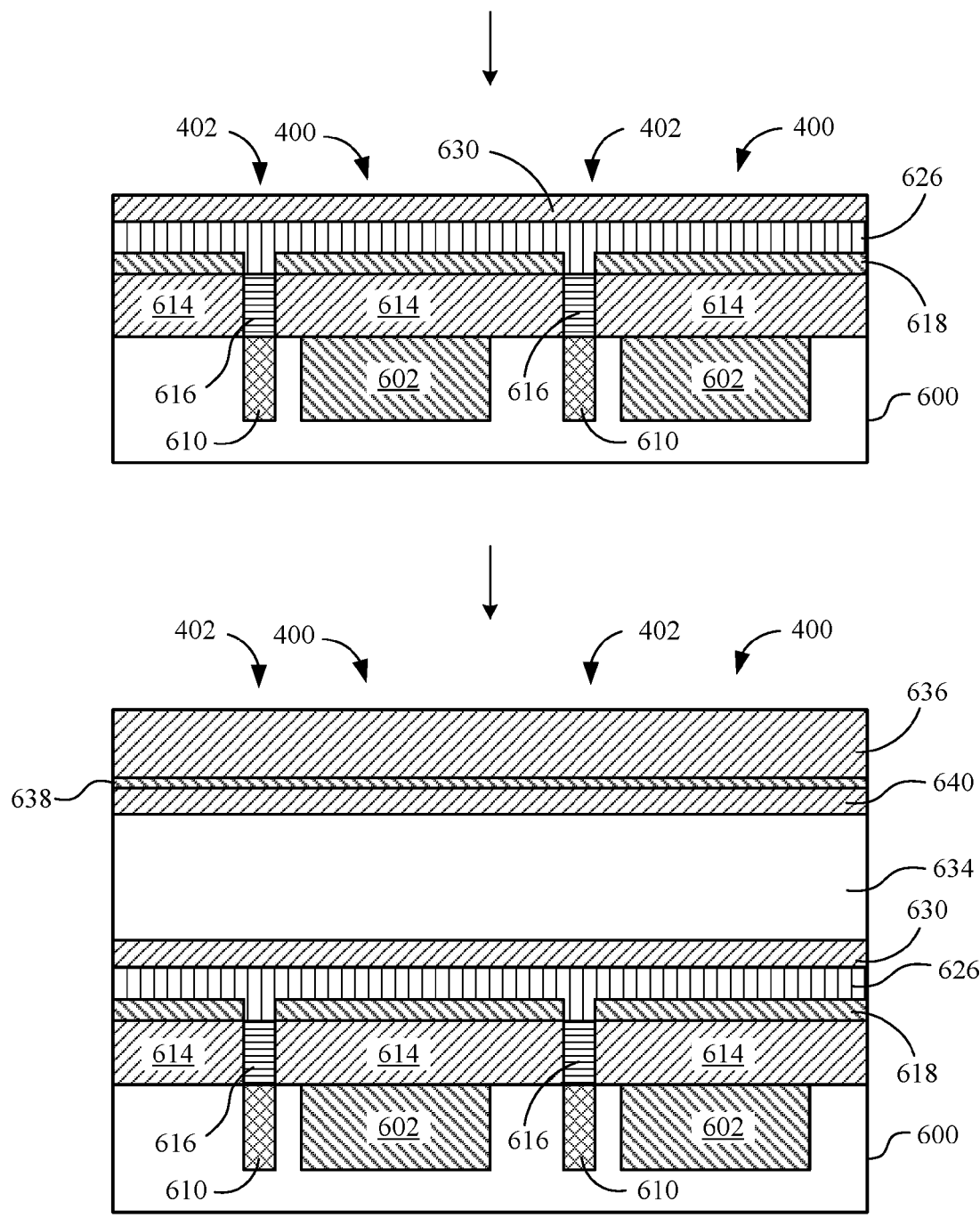

FIGS. 6A-6C are cross sectional views of a portion of a semiconductor wafer 600 during successive steps of the process of manufacturing display/image sensor 202. Although separated for the sake of clear explanation, some of the steps can be performed simultaneously or divided into a greater number of steps. In addition, some of the steps can be performed in a different order.

FIG. 6A shows the first four steps in the manufacturing process. In a first step, a silicon wafer 600 is provided. Then, in a second step, semiconductor devices 602 that will be included in a plurality of display pixels 400 are formed in wafer 600 by doping certain areas with p-type or n-type dopants, and forming conducting and insulating structures around the doped areas to form transistors, which are the functional components of each of display pixels 400. In a third step, semiconductor devices 610 that will be included in a plurality image sensor pixels 402 are formed in silicon wafer 600. Next, in a fourth step, a plurality of conductive layers 614 are formed (metallization) to create electrical connections between the electronic devices formed in the second and third steps. The design of conductive layers 614 defines openings over light sensitive areas of image sensor pixels 610 to reduce or eliminate the blockage of any light (e.g., infrared light) that might impinge on image sensors 610.

FIG. 6B shows the next three steps in the manufacturing process. In a fifth step, optional light guides 616 are formed in the openings defined by conductive layers 614, and an electrode layer 618 is formed over conductive layers 614 and light guides 616. Then, in a sixth step, openings 622 are formed in electrode layer 618, to divide electrode layer 618 into a plurality of individual pixel electrodes (e.g., reflective pixel mirrors), each electrically coupled to the circuitry 602 of an associated display pixel 400 via a respective portion of conductive layers 614. The openings in electrode layer 618 are also disposed over light guides 616, so that incident light is efficiently transmitted to sensor pixels 402. Next, in a seventh step, a passivation layer 626 (e.g., an oxide layer, a nitride layer, combination layer, etc.) is formed over the top of electrode layer 618 and light guides 616. Passivation layer 626 acts as a protective barrier, to prevent moisture and other atmospheric contaminants from degrading the pixel electrodes of electrode layer 618.

FIG. 6C shows the final steps in the manufacturing process. In an eighth step, an alignment layer 630 is formed over passivation layer 626. Alignment layer 630 facilitates the alignment of liquid crystals in the next layer. In the example embodiment, alignment layer 630 is made of polyimide, which, when rubbed in a certain direction prior to assembly, causes the liquid crystals to align in a predictable manner. In a ninth step, a liquid crystal layer 634 is deposited above alignment layer 630. Then, liquid crystal layer 634 is covered with a common electrode, which includes a glass substrate 636, a transparent, conductive layer 638 (e.g., indium tin oxide) formed on glass substrate 636, and a second alignment layer 640 (e.g., polyimide) formed on the conductive layer 638.

Figure 7:
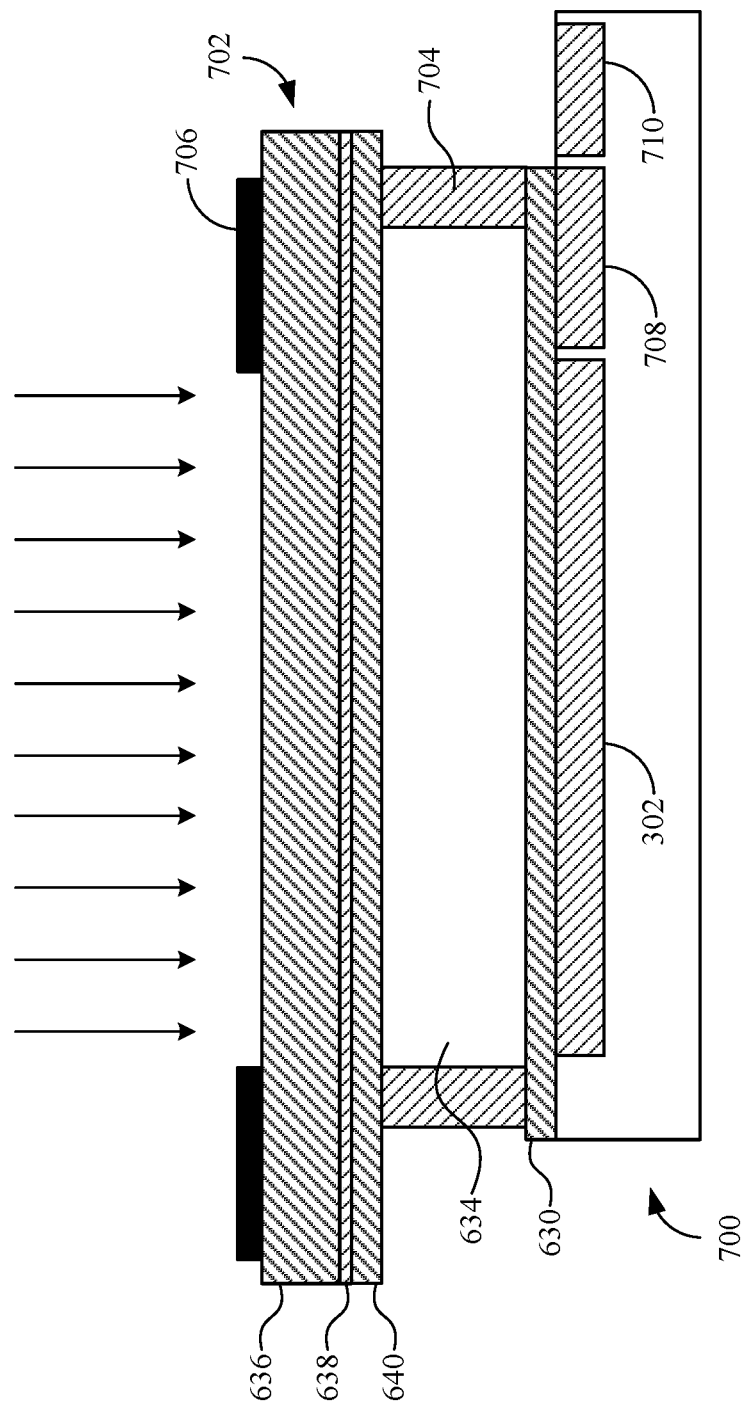
FIG. 7 is a cross-sectional view of a completed display/image sensor.

FIG. 7 shows a completed display/image sensor 202, including a die 700 from wafer 600, a common electrode 702, and a gasket 704 disposed there between. Gasket 704 adheres to die 700 and common electrode 702 to retain liquid crystal layer 634 and to prevent contamination of liquid crystal layer 634. Display/image sensor 202 also includes a black photomask 706, which allows light to impinge on display/image sensor pixel arrays 302, but shields other portions of die 700 (e.g., where controller 304, user/data interface 306. or any other circuitry of display/image sensor 202 might be formed) from stray light. Such additional circuitry is shown representationally as circuitry 708 in FIG. 7. Display/image sensor 202 can be a fully self-contained device, or can include electrical contacts 710 to facilitate connection to other devices. Contacts 710 also facilitate connection to a power source (not shown).

Figure 8:
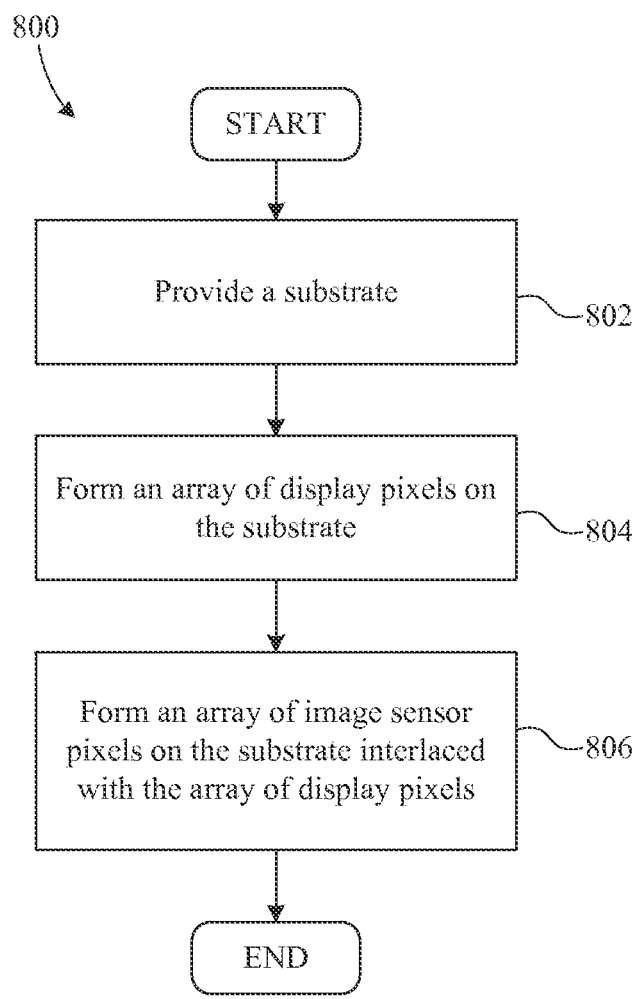
FIG. 8 is a flow chart summarizing an example method of manufacturing a display/image sensor.

FIG. 8 is a flowchart summarizing an example method 800 for manufacturing a display/image sensor. In a first step 802, a substrate (e.g. a semiconductor wafer) is provided. Then, in a second step 804, an array of display pixels is formed on the substrate. Next, in a third step 806, an array of image sensor pixels is also formed on the same substrate by interlacing the array of image sensor pixels with the array of display pixels.

Figure 9:
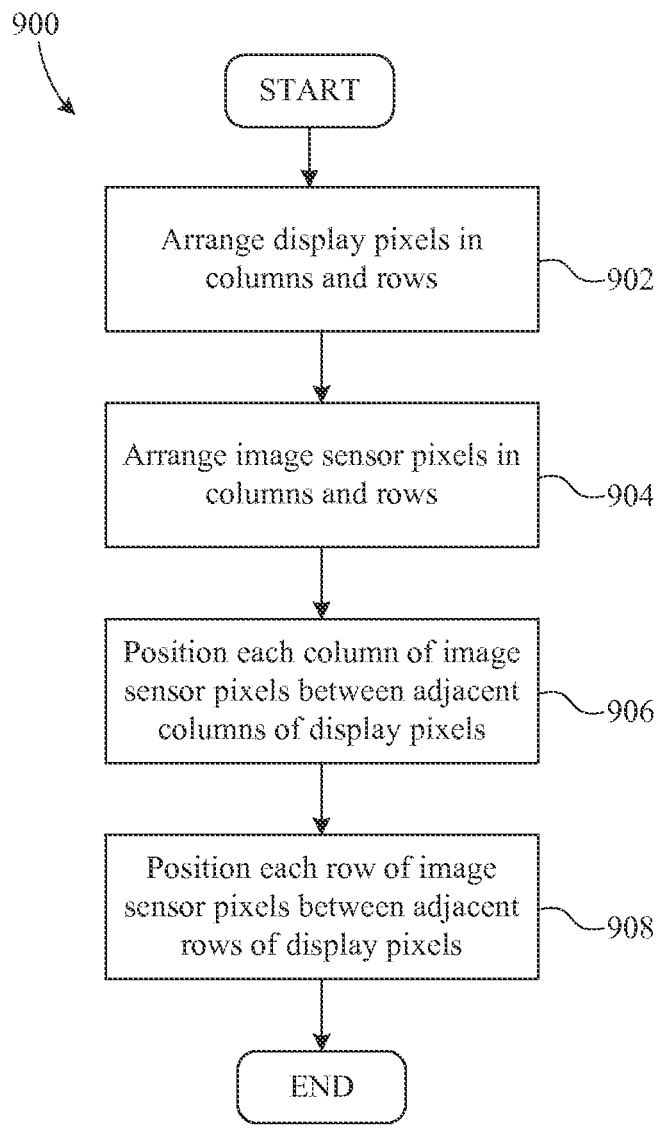
FIG. 9 is a flow chart summarizing an example method of arranging display pixels and image sensor pixels on a substrate.

FIG. 9 is a flowchart summarizing an example method 900 for arranging display pixels and image sensor pixels on a substrate. In a first step 902, display pixels are arranged in columns and rows. Then, in a second step 904, image sensor pixels are arranged in rows and columns. Next, in a third step 906, each column of image sensor pixels is positioned between adjacent columns of display pixels. Finally, in a fourth step 908, each row of image sensor pixels is position between adjacent rows of display pixels. This method is advantageous, because it allows a display/image sensor to be produced using typical microchip fabrication techniques, while greatly improving display image quality and image sensor resolution.

The description of particular embodiments of the present invention is now complete. Many of the described features may be substituted, altered or omitted without departing from the scope of the invention. For example, alternate numbers of display and imaging pixels can be used. As another example, additional and/or alternate circuits can be utilized for loading data into display pixels 400 and reading data out of image sensor pixels 402. As yet another example, the combination display/image sensor can be utilized in devices other than head mounted devices including, but not limited to, customer service kiosks, security systems, and advertisement displays. These and other deviations from the particular embodiments shown will be apparent to those skilled in the art, particularly in view of the foregoing disclosure.

We claim:

1. An integrated image sensor and display device, comprising:
   a substrate;
   a plurality of display pixels formed on said substrate, said plurality of display pixels being arranged in rows and columns and in a uniform grid; and
   a plurality of image sensor pixels formed on said substrate, said plurality of image sensor pixels being arranged in rows and columns and in a uniform grid, each of said image sensor pixels having a center disposed between adjacent rows of said display pixels and between adjacent columns of said display pixels; and wherein
   said plurality of display pixels and said plurality of image sensor pixels are interlaced;
   a pitch between adjacent columns of said display pixels is the same as a pitch between adjacent columns of said image sensor pixels; and
   a pitch between adjacent rows of said display pixels is the same as a pitch between adjacent rows of said image sensor pixels.

2. The integrated image sensor and display device of claim 1, wherein each of said display pixels has an area at least 24 times larger than the area of each of said image sensor pixels.

3. The integrated image sensor and display device of claim 1, wherein only one of said image sensor pixels is disposed between each group of 4 adjacent display pixels.

4. The integrated image sensor and display device of claim 3, wherein each of said image sensor pixels is disposed between truncated corners of 4 adjacent display pixels.

5. The integrated image sensor and display device of claim 1, wherein each of said image sensor pixels is spaced apart from every other one of said image sensor pixels by a distance greater than a width of one of said image sensor pixels.

6. The integrated image sensor and display device of claim 1, wherein:
   said plurality of image sensor pixels includes one fewer rows than said plurality of display pixels; and
   said plurality of image sensor pixels includes one fewer columns than said plurality of display pixels.

7. The integrated image sensor and display device of claim 1, further comprising:
   a plurality of pixel electrodes each associated with one of said display pixels; and
   at least one metal interconnect layer disposed above said plurality of image sensor pixels and below said pixel electrodes of said display pixels, said at least one metal interconnect layer being operative to electronically couple said plurality of pixel electrodes with electronic devices formed in said substrate, said at least one metal interconnect layer defining openings above said plurality of image sensor pixels.

8. The integrated image sensor and display device of claim 7, further comprising light guides disposed in said openings and operative to direct incident light to said image sensor pixels.

9. The integrated image sensor and display device of claim 1, wherein said display pixels are liquid crystal on silicon (LCOS) pixels.

10. The integrated image sensor and display device of claim 9, wherein said image sensor pixels are infrared (IR) light sensor pixels.

11. The integrated image sensor and display device of claim 10, wherein said substrate is a silicon substrate.

12. A method of manufacturing an integrated image sensor and display device, said method comprising:
    providing a substrate;
    forming a plurality of display pixels on said substrate, said display pixels being arranged in rows and columns and in a uniform grid; and
    forming a plurality of image sensor pixels on said substrate, said plurality of image sensor pixels being arranged in rows and columns and in a uniform grid, each of said image sensor pixels having a center disposed between adjacent rows of said display pixels and between adjacent columns of said display pixels; and wherein
    said plurality of display pixels and said plurality of image sensor pixels are interlaced;
    a pitch between adjacent columns of said display pixels is the same as a pitch between adjacent columns of said image sensor pixels; and
    a pitch between adjacent rows of said display pixels is the same as a pitch between adjacent rows of said image sensor pixels.

13. The method of claim 12, wherein said step of forming said plurality of display pixels includes forming each of said display pixels with an area at least 24 times larger than the area of each of said image sensor pixels.

14. The method of claim 12, wherein said step of forming said plurality of image sensor pixels includes arranging only one of said image sensor pixels between each group of four adjacent display pixels.

15. The method of claim 14, wherein said step of forming said plurality of image sensor pixels includes arranging each of said image sensor pixels between truncated corners of 4 adjacent display pixels.

16. The method of claim 12, wherein said step of forming said plurality of image sensor pixels includes arranging each of said image sensor pixels to be spaced apart from every other one of said image sensor pixels by a distance greater than a width of one of said image sensor pixels.

17. The method of claim 12, wherein said step of forming said plurality of image sensor pixels includes:

forming one fewer rows of said image sensor pixels than of said display pixels; and forming one fewer columns of said image sensor pixels than of said display pixels.

18. The method of claim 12, further comprising:
forming a plurality of pixel electrodes each associated with one of said display pixels; and
forming at least one metal interconnect layer above said plurality of image sensor pixels and below said pixel electrodes to electronically couple said pixel electrodes to electronic devices formed in said substrate; and wherein
said at least one metal interconnect layer defines openings over said image sensor pixels.

19. The method of claim 18, further comprising forming light guides in said openings.

20. The method of claim 12, wherein said display pixels are liquid crystal on silicon (LCOS) display pixels.

21. The method of claim 20, wherein said image sensor pixels are infrared (IR) light sensor pixels.

22. The method of claim 21, wherein said substrate is a silicon substrate.

23. A sensor enabled display, comprising:
a first light source configured to emit light within a first range of wavelengths;
a second light source configured to emit light within a second range of wavelengths to illuminate an object;
a display panel including a substrate, a plurality of display pixels arranged on said substrate in rows and columns and in a uniform grid, and a plurality of image sensor pixels arranged on said substrate in rows and columns and in a uniform grid; and
optics configured to direct said light from said first light source to said display pixels of said panel to display an image and to direct light from said second light source reflected from said object to said image sensor pixels; and wherein
said plurality of display pixels and said plurality of image sensor pixels are interlaced;
a pitch between adjacent columns of said display pixels is the same as a pitch between adjacent columns of said image sensor pixels;
a pitch between adjacent rows of said display pixels is the same as a pitch between adjacent rows of said image sensor pixels; and
each of said image sensor pixels has a center disposed between adjacent rows of said display pixels and between adjacent columns of said display pixels.

24. The integrated image sensor and display device of claim 1, wherein each of said image sensor pixels is disposed between a different group of 4 adjacent display pixels.

* * * * *